(12) United States Patent
Xie et al.

(10) Patent No.: US 11,943,884 B2
(45) Date of Patent: Mar. 26, 2024

(54) FOLDABLE DISPLAY APPARATUS AND FOLDABLE DISPLAY TERMINAL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhihao Xie, Beijing (CN); Binfeng Feng, Beijing (CN); Chao Wang, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 391 days.

(21) Appl. No.: 17/427,011

(22) PCT Filed: Dec. 28, 2020

(86) PCT No.: PCT/CN2020/140233
§ 371 (c)(1),
(2) Date: Jul. 29, 2021

(87) PCT Pub. No.: WO2021/136192
PCT Pub. Date: Jul. 8, 2021

(65) Prior Publication Data
US 2022/0124925 A1    Apr. 21, 2022

(30) Foreign Application Priority Data
Jan. 3, 2020 (CN) .......................... 202010003748.2

(51) Int. Cl.
*H05K 5/00* (2006.01)
*H05K 5/02* (2006.01)

(52) U.S. Cl.
CPC ......... *H05K 5/0226* (2013.01); *H05K 5/0017* (2013.01)

(58) Field of Classification Search
CPC ...... H10K 50/86; H10K 50/841; H10K 50/84; H10K 50/8426; H10K 2102/311;
(Continued)

(56) References Cited

U.S. PATENT DOCUMENTS

2017/0374750 A1* 12/2017 Sun ..................... H05K 5/0017
2018/0192527 A1* 7/2018 Yun ......................... G09F 9/301
(Continued)

FOREIGN PATENT DOCUMENTS

CN       106788536 A       5/2017
CN       109036142 A      12/2018
(Continued)

OTHER PUBLICATIONS

Translation of Li CN 110689811 A (Year: 2020).*
(Continued)

*Primary Examiner* — Jacob R Crum
(74) *Attorney, Agent, or Firm* — IP & T GROUP LLP

(57) ABSTRACT

A foldable display apparatus includes: a housing, a display panel and one or more stretching assemblies. The housing includes a first sub-housing, a second sub-housing and a rotating shaft. The first and second sub-housings are rotatably connected through the rotating shaft. The display panel includes a bendable portion, and a first non-bendable portion and a second non-bendable portion respectively located on two sides of the bendable portion. The first non-bendable portion and the second non-bendable portion are accommodated in the first sub-housing and the second sub-housing, respectively. The bendable portion corresponds to the rotating shaft. At least one stretching assembly in the one or more stretching assemblies fixed to the second non-bendable
(Continued)

portion and the second sub-housing, which is configured to apply force directed from the first non-bendable portion to the second non-bendable portion when foldable display apparatus is unfolded from a fold state.

18 Claims, 12 Drawing Sheets

(58) Field of Classification Search
CPC ............ H04M 1/0269; H04M 1/0268; H05K 5/0226; H05K 5/0017; G06F 1/1641; G06F 1/1652
See application file for complete search history.

(56) References Cited

U.S. PATENT DOCUMENTS

| | | | | |
|---|---|---|---|---|
| 2019/0200466 A1* | 6/2019 | Kim | ................... | G06F 1/1652 |
| 2019/0320048 A1 | 10/2019 | Yang et al. | | |
| 2019/0324502 A1* | 10/2019 | Chang | ................... | G06F 1/1652 |

FOREIGN PATENT DOCUMENTS

| | | | | |
|---|---|---|---|---|
| CN | 208638396 U | 3/2019 | | |
| CN | 109600466 A | 4/2019 | | |
| CN | 109981850 A | 7/2019 | | |
| CN | 110364085 A | 10/2019 | | |
| CN | 110570769 A | 12/2019 | | |
| CN | 209787222 U | 12/2019 | | |
| CN | 209860957 U | 12/2019 | | |
| CN | 110689811 A | * 1/2020 | ........... | G01L 5/0028 |
| CN | 111182102 A | 5/2020 | | |
| EP | 3557852 A1 | 10/2019 | | |
| WO | 2018/110749 A1 | 6/2018 | | |

OTHER PUBLICATIONS

First Office Action of Priority Application No. CN 202010003748.2 issued by the Chinese Patent Office dated Sep. 15, 2020.
The Second Office Action of Priority Application No. CN 202010003748.2 issued by the Chinese Patent Office dated Mar. 29, 2021.
The Third Office Action of Priority Application No. CN 202010003748.2 issued by the Chinese Patent Office dated Aug. 17, 2021.
Notification to Grant Patent Right for invention of Priority Application No. CN 202010003748.2 issued by the Chinese Patent Office dated Nov. 10, 2021.

* cited by examiner

FOLDABLE DISPLAY APPARATUS AND FOLDABLE DISPLAY TERMINAL

CROSS-REFERENCE TO RELATED APPLICATIONS

This application is a national phase entry under 35 USC 371 of International Patent Application No. PCT/CN2020/140233 filed on Dec. 28, 2020, which claims priority to Chinese Patent Application No. 202010003748.2, filed on Jan. 3, 2020, which are incorporated herein by reference in their entirety.

TECHNICAL FIELD

The present disclosure relates to the field of display technologies, and in particular, to a foldable display apparatus and a foldable display terminal.

BACKGROUND

With continuous development of display technologies, foldable display terminals become a development trend of electronic products. When in a folded state, the foldable display terminal may be carried by an user easily due to a reduced area thereof, and when being unfolded, the foldable display terminal has a large display area and a good display effect.

SUMMARY

In one aspect, a foldable display apparatus is provided. The foldable display apparatus includes a housing, a display panel and one or more stretching assemblies. The housing includes a first sub-housing, a second sub-housing and a rotating shaft, and the first sub-housing and the second sub-housing are rotatably connected through the rotating shaft. The display panel includes a bendable portion, and a first non-bendable portion and a second non-bendable portion respectively located on two sides of the bendable portion. The first non-bendable portion is accommodated in the first sub-housing, the second non-bendable portion is accommodated in the second sub-housing, and the bendable portion corresponds to the rotating shaft between the first sub-housing and the second sub-housing. The at least one stretching assembly in the one or more stretching assemblies is fixed to the second non-bendable portion and the second sub-housing, and the at least one stretching assembly is configured to apply force directed from the first non-bendable portion to the second non-bendable portion when the foldable display apparatus is unfolded from a fold state.

In some embodiments, the foldable display apparatus further includes at least one fixing assembly. The at least one fixing assembly includes: a first fixing seat fixed on a side of the first non-bendable portion proximate to the first sub-housing; a first connecting rod, one end of the first connecting rod being fixedly connected to the first fixing seat, and another end of the first connecting rod being rotatably connected to the rotating shaft; a second fixing seat fixed on a side of the second non-bendable portion proximate to the second sub-housing; and a second connecting rod, one end of the second connecting rod being slidably connected to the second fixing seat, and another end of the second connecting rod being rotatably connected to the rotating shaft.

In some embodiments, the one or more stretching assemblies include a plurality of stretching assemblies. A part of the plurality of stretching assemblies are fixed to the first non-bendable portion and the first sub-housing, and configured to apply force directed from the second non-bendable portion to the first non-bendable portion when the foldable display apparatus is unfolded from a folded state.

In some embodiments, the foldable display apparatus further includes at least one fixing assembly. The at least one fixing assembly includes: a first fixing seat fixed on a side of the first non-bendable portion proximate to the first sub-housing; a first connecting rod, one end of the first connecting rod being fixedly connected to the first fixing seat, and another end of the first connecting rod being rotatably connected to the rotating shaft; a second fixing seat fixed on a side of the second non-bendable portion proximate to the second sub-housing; and a second connecting rod, one end of the second connecting rod being slidably connected to the second fixing seat, and another end of the second connecting rod being rotatably connected to the rotating shaft.

In some embodiments, the stretching assembly includes a spring. One end of the spring is fixed on a side of the second non-bendable portion proximate to the second sub-housing, and another end of the spring is fixed on a side of the second sub-housing proximate to the second non-bendable portion.

In some embodiments, the end of the spring fixed to the second sub-housing is closer to the rotating shaft than the end of the spring fixed to the second non-bendable portion.

In some embodiments, the end of the spring fixed to the second sub-housing is farther away from the rotating shaft than the end of the spring fixed to the second non-bendable portion.

In some embodiments, the stretching assembly includes a spring. One end of the spring is fixed on the side of the second non-bendable portion proximate to the second sub-housing, and another end of the spring is fixed on a side of the second sub-housing proximate to the second non-bendable portion.

In some embodiments, the end of the spring fixed to the second sub-housing is closer to the rotating shaft than the end of the spring fixed to the second non-bendable portion.

In some embodiments, the end of the spring fixed to the second sub-housing is farther away from the rotating shaft than the end of the spring fixed to the second non-bendable portion.

In some embodiments, the stretching assembly further includes: a first spring fixing support and a second spring fixing support. The first spring fixing support and second spring fixing support each include a base and a sleeve. One end of the sleeve has an opening, and an outer sidewall of the sleeve is fixed on the base. The base of the first spring fixing support is fixed on the side of the second sub-housing proximate to the second non-bendable portion. The base of the second spring fixing support is fixed on the side of the second non-bendable portion proximate to the second sub-housing. The opening of the sleeve of the first spring fixing support and the opening of the sleeve of the second spring fixing support are disposed opposite to each other in a direction perpendicular to an axial direction of the rotating shaft. One end of the spring passes through the opening of the sleeve of the first spring fixing support and is fixed on an inner wall of the sleeve of the first spring fixing support, and another end of the spring passes through the opening of the sleeve of the second spring fixing support and is fixed on an inner wall of the sleeve of the second spring fixing support.

In some embodiments, the stretching assembly includes: a micro-motor fixed on a side of the second sub-housing proximate to the second non-bendable portion, and a flexible sheet being configured to be windable on a rotating shaft of the micro-motor. One end of the flexible sheet is fixed on a side of the second non-bendable portion proximate to the second sub-housing, and is closer to the rotating shaft of the housing than the micro-motor, and another opposite end of the flexible sheet is fixed on the rotating shaft of the micro-motor.

In some embodiments, a size of the micro-motor is sufficient to enable the micro-motor to be installed between the housing and the display panel.

In some embodiments, a material of the flexible sheet is at least one of polyimide or polyethylene terephthalate.

In some embodiments, the at least one fixing assembly further includes a sliding frame and a sliding block. The sliding frame is disposed on a surface of the second fixing seat proximate to the second sub-housing, the sliding frame includes a plurality of sidewalls, and the plurality of sidewalls are connected end to end in sequence to form a cavity. The sliding block is disposed at the end of the second connecting rod connected to the second fixing seat and is located in the cavity, and the sliding block is configured to be moveable in the sliding frame. A width of the sliding frame is greater than a width of the sliding block in a sliding direction of the sliding block.

In some embodiments, a width of the cavity in the sliding direction of the sliding block is d. The width of the sliding block in the sliding direction of the sliding block is d1. A distance that the sliding block capable of moving in the sliding frame in the sliding direction of the sliding block is d2, and d is equal to a sum of d1 and d2 (d=d1+d2).

In some embodiments, the at least one fixing assembly further includes magnetic films, and each magnetic film is disposed on a respective one of two sidewalls inside the sliding frame in the sliding direction of the sliding block. The magnetic films are each configured to attract the sliding block.

In some embodiments, the at least one fixing assembly further includes an upper cover. The upper cover is disposed on the sliding frame, and a portion of the upper cover facing the second connecting rod has an opening. The opening is configured to allow the second connecting rod to move therethrough.

In another aspect, a foldable display terminal is provided. The foldable display terminal includes the above-mentioned foldable display apparatus.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description can be regarded as schematic diagrams, and are not limitations on actual sizes of products, actual processes of methods and actual timings of signals to which the embodiments of the present disclosure relate.

FIG. 8A-1 is a front view of a spring stretching assembly, in accordance with some embodiments;

FIG. 8A-2 is an enlargement view of the spring stretching assembly in FIG. 8A-1;

DETAILED DESCRIPTION

Figure 1:
FIG. 1 is a schematic diagram showing a bulge phenomenon of a bendable region after the bendable region of a display panel in an example is bend.

Technical solutions in some embodiments of the present disclosure will be described clearly and completely below with reference to accompanying drawings. Obviously, the described embodiments are merely some but not all of embodiments of the present disclosure. All other embodiments obtained on a basis of the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are only used for descriptive purposes, and are not to be construed as indicating or implying relative importance or implicitly indicating the number of indicated technical features. Thus, features defined with "first", "second" may explicitly or implicitly include one or more of the features. In the description of the embodiments of the present disclosure, the term "a/the plurality of" means two or more unless otherwise specified.

In the description of some embodiments of the present disclosure, it will be understood that orientations or positional relationships indicated by terms "center", "upper", "lower", "front", "rear", "left", "right", "vertical", "horizontal", "top", "bottom", "inner", "outer", etc. are based on orientations or positional relationships shown in the drawings, which are merely to facilitate and simplify the description of the present disclosure, and are not to indicate or imply that the referred apparatuses or elements must have a particular orientation, or must be constructed or operated in a particular orientation. Therefore, they should not be construed as limitations to the present disclosure.

In the description of some embodiments, the terms "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

Some embodiments of the present disclosure provide a foldable display terminal. The foldable display terminal is, for example, a mobile phone, a tablet computer, a smart wearable product (a smart watch or a smart bracelet), a personal digital assistant (PDA), or an on-board computer. The embodiments of the present disclosure do not specifically limit a specific form of the foldable display terminal.

The foldable display terminal includes a foldable display apparatus and various electronic components, such as a camera, a battery, and a circuit board.

Figure 2:
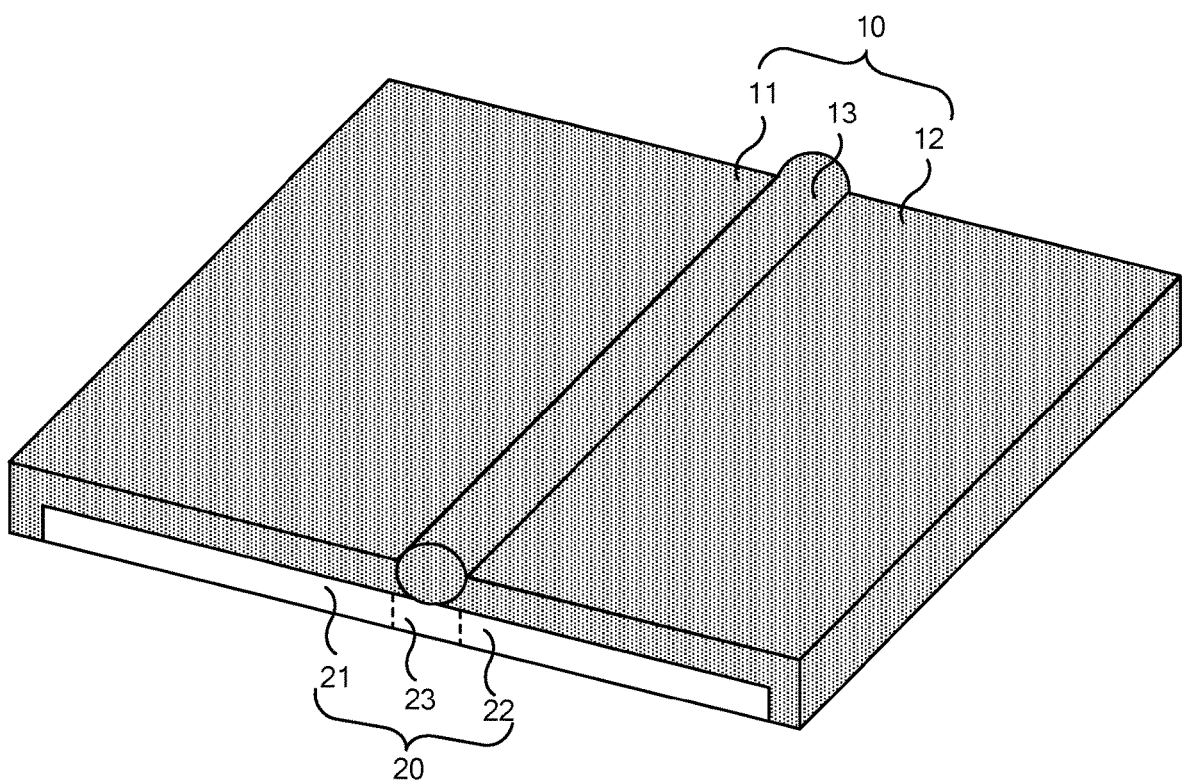
FIG. 2 is a diagram showing a structure of a foldable display apparatus, in accordance with some embodiments.

In some embodiments, as shown in FIG. 2, the foldable display apparatus includes a housing 10. The housing 10 includes a first sub-housing 11, a second sub-housing 12, and a rotating shaft 13 located between the first sub-housing 11 and the second sub-housing 12. The first sub-housing 11 and the second sub-housing 12 are located on two sides of the rotating shaft 13 and are rotatably connected through the rotating shaft 13. The first sub-housing 11 and the second sub-housing 12 may independently rotate around the rotating shaft 13 to fold and unfold the foldable display apparatus.

As shown in FIG. 2, the foldable display apparatus further includes a display panel 20 for display images. In order to enable the display panel 20 to be folded, the display panel 20 is a flexible display panel and can be bent.

Figure 3:
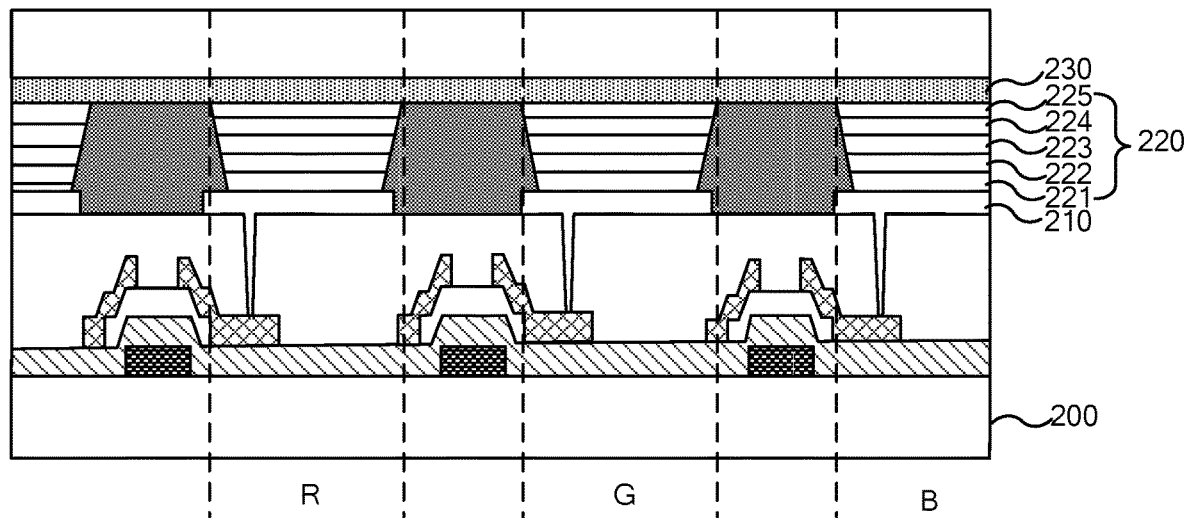
FIG. 3 is a diagram showing a structure of a flexible display panel, in accordance with some embodiments.

For example, the display panel 20 may be a flexible organic light-emitting diode (OLED) display panel. As shown in FIG. 3, the flexible OLED display panel includes a flexible base 200 and OLED devices disposed on the flexible base. A material of the flexible base 200 is, for example, polyimide (PI). That is, a base material of the OLED display panel is a flexible material, and the OLED display panel can be bent. The OLED device may emit light by itself, and there is no need to provide a backlight source in the display apparatus with the OLED display panel.

The flexible OLED display panel further includes gate lines provided on the flexible base in a direction, data lines that cross with the gate lines in an insulating manner, and common power lines. The common power lines are usually parallel to the data lines. Herein, a sub-pixel may be defined by gate lines and data lines (and common power lines), which is not limited thereto. The sub-pixel refers to a basic unit for display an image, and the OLED device is located in the sub-pixel, so that the flexible OLED display panel displays an image through a plurality of sub-pixels.

The flexible OLED display panel further includes a pixel circuit formed in each sub-pixel. The pixel circuit is electrically connected to the OLED device to drive the OLED device to emit light. The pixel circuit basically includes a switching thin film transistor, a driving thin film transistor, and a capacitor. In an example where an active driving type flexible OLED display panel has one sub-pixel with a 2T1C structure of two thin film transistors (i.e., one switching thin film transistor and one driving thin film transistor representing by "T"), and one capacitor (representing by "C"), the capacitor includes a first electrode plate and a second electrode plate. An interlayer insulating film is provided between the first electrode plate and the second electrode plate as a dielectric. The switching thin film transistor and the driving thin film transistor each include a semiconductor layer, a gate, a source, and a drain.

The semiconductor layer of the switching thin film transistor and the semiconductor layer of the driving thin film transistor may be composed of amorphous silicon, single crystal silicon, polycrystalline silicon, or oxide semiconductor.

The semiconductor layer of the switching thin film transistor and the semiconductor layer of the driving thin film transistor each include: a channel region that is not doped with an impurity, and a source region and a drain region that are formed by doping the impurity on two sides of the channel region. Herein, the impurity vary with types of thin film transistors, and may be an N-type impurity or P-type impurity.

The gate of the switching thin film transistor is connected to a gate line, the source of the switching thin film transistor is connected to a data line, and the drain of the switching thin film transistor is connected to the gate of the driving thin film transistor. The source of the driving thin film transistor is connected to a common power line, and the drain of the driving thin film transistor is connected to a pixel electrode 210 of the OLED device through a via hole. The first electrode plate of the capacitor is connected to the gate of the driving thin film transistor, and the second electrode plate of the capacitor is connected to the source of the driving thin film transistor.

The switching thin film transistor is turned on through a gate voltage applied to the gate line, thereby transmitting a data voltage applied to the data line to the driving thin film transistor. There is a certain difference between a common voltage applied from the common electrode line to the driving thin film transistor and the data voltage transmitted from the switching thin film transistor to the driving thin film transistor. A voltage corresponding to the difference is stored in the capacitor. A current corresponding to the voltage stored in the capacitor flows into the OLED device through the driving thin film transistor, so that the OLED device emits light.

As shown in FIG. 3, the OLED device includes a pixel electrode 210, a light-emitting functional layer 220, and a common electrode 230. One of the pixel electrode 210 and the common electrode 230 is an anode (for supplying holes), and the other is a cathode (for supplying electrons). Electrons and holes are injected from the pixel electrode 210 and the common electrode 230 into the light-emitting functional layer 220, and when excitons generated by combining the holes and the electrons transition from an excited state to a ground state, light emission is generated. FIG. 3 merely shows the driving transistor, and does not show the switching transistor.

The pixel electrode 210 may be formed of metal with high reflectivity, and the common electrode 230 may be formed of a transparent conductive film. In this case, light emitting from the light-emitting functional layer 220 is reflected by the pixel electrode 210 and exits to outside through the common electrode 230, and thus a top-emission type OLED device is formed. However, it is not limited thereto. In a case where the pixel electrode 210 is formed of a transparent conductive film and the common electrode 230 is formed of metal with high reflectivity, a bottom-emission type OLED device may be formed. Of course, in a case where both the pixel electrode 210 and the common electrode 230 are formed of a transparent conductive film, a double-sided emission OLED device may be formed.

The light-emitting functional layer 220 may include an organic light-emitting layer 223, and in addition, may further include at least one of a hole injection layer (HIL) 221, a hole transport layer (HTL) 222, an electron transport layer (ETL) 224, and an electron injection layer (EIL) 225. In a case where the light-emitting functional layer 220 includes all the above layers, the hole injection layer 221, the hole transport layer 222, the organic light-emitting layer 223, the electron transport layer 224, and the electron injection layer 225 are stacked on top of one another on the pixel electrode 210 as the anode.

It will be noted that FIG. 3 shows an example in which hole injection layers 221, hole transport layers 222, electron transport layers 224, and electron injection layers 225 in different OLED devices are disconnected, but the embodiments of the present disclosure is not limited thereto. In some embodiments, in the different OLED devices, the hole injection layers 221 may also be connected as a whole, the hole transport layers 222 may also be connected as a whole, the electron transport layers 224 may also be connected as a whole, and the electron injection layers 225 may also be connected as a whole.

The light-emitting functional layers 220 may include red light-emitting functional layers that emit red light, green light-emitting functional layers that emit green light, and blue light-emitting functional layers that emit blue light. The red light-emitting functional layer, the green light-emitting functional layer and the blue light-emitting functional layer respectively form a red sub-pixel R, a green sub-pixel G, and a blue sub-pixel B to display a color image.

As shown in FIG. 2, the display panel 20 includes a bendable portion 23, and a first non-bendable portion 21 and a second non-bendable portion 22 respectively located on two sides of the bendable portion 23. The first non-bendable portion 21 is accommodated in the first sub-housing 11, and the second non-bendable portion 22 is accommodated in the second sub-housing 12. The bendable portion 23 corresponds to the rotating shaft 13 between the first sub-housing 11 and the second sub-housing 12. When the foldable display apparatus is folded from an unfolded state, the display panel 20 may be bent along the bendable portion 23.

In this case, a side of the display panel 20 connected to the housing 10 is a non-display side of the display panel 20, and a side of the display panel 20 away from the housing 10 is a display side of the display panel 20.

Figure 9A:
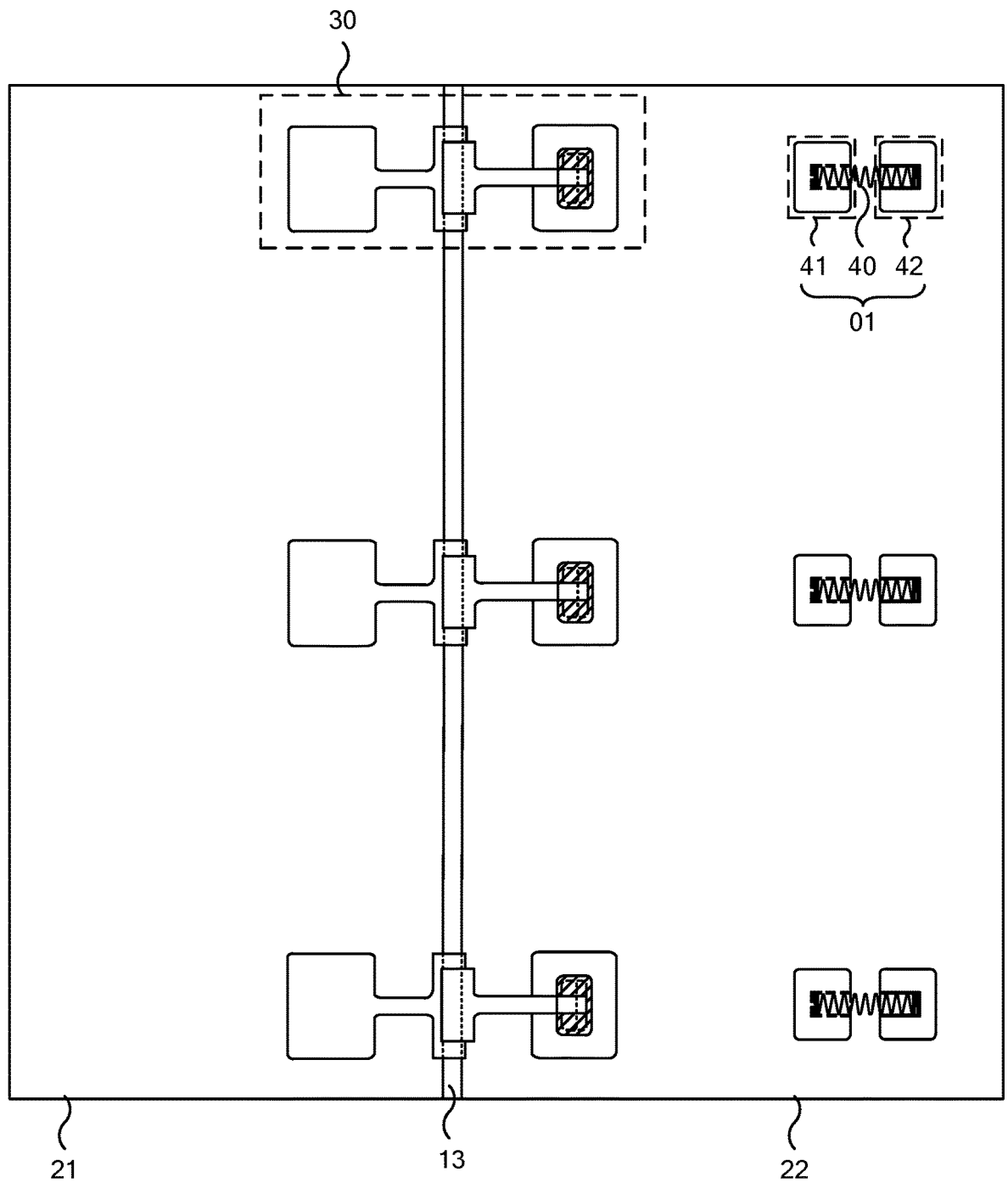
FIG. 9A is a front view of a foldable display apparatus, in accordance with some embodiments.
Figure 11A:
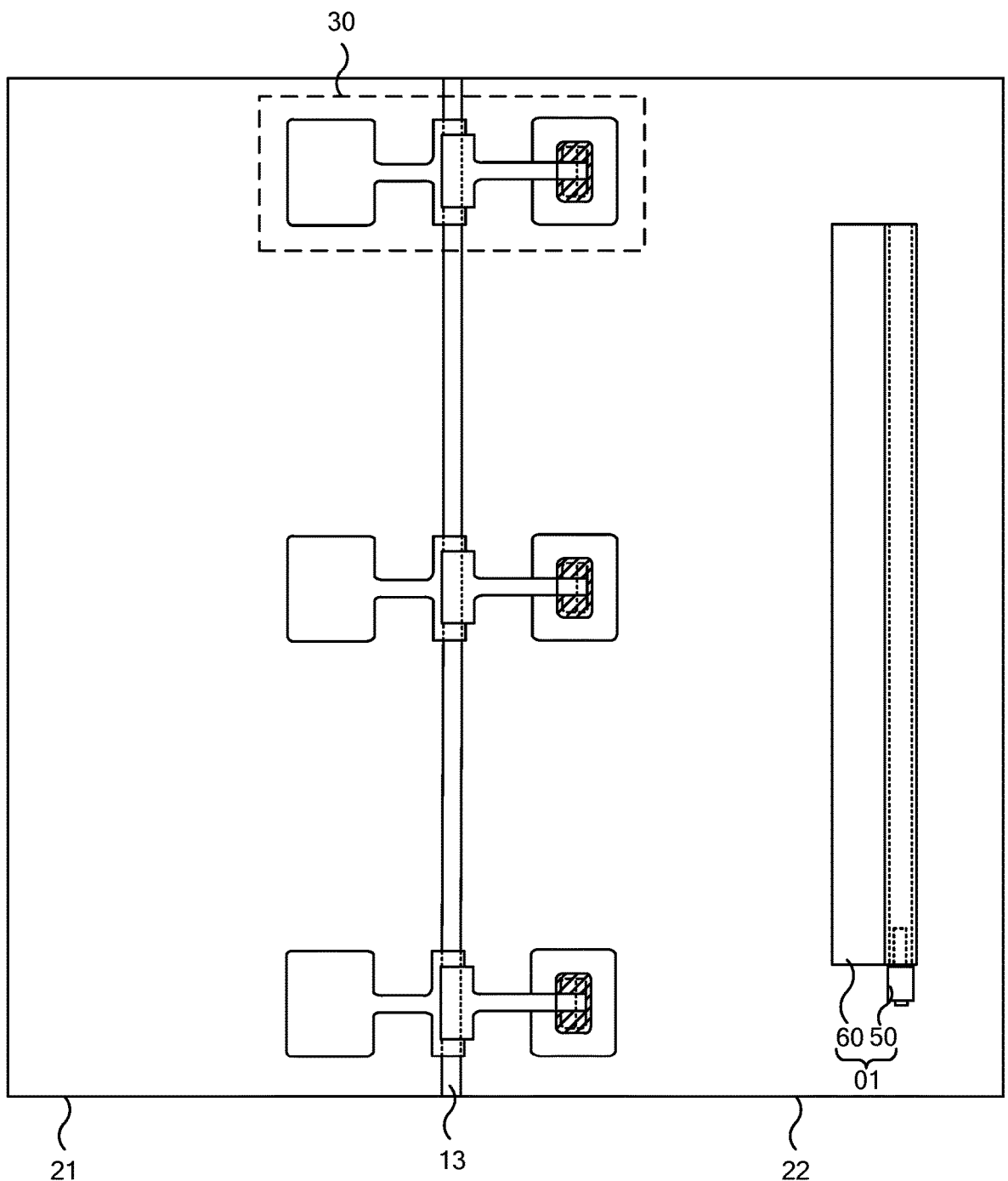
FIG. 11A is a front view of another foldable display apparatus, in accordance with some embodiments.

In some embodiments, as shown in FIGS. 9A and 11A, in order to reduce an impact on the display panel 20 during a process of folding and unfolding the foldable display apparatus, the foldable display apparatus further includes at least one fixing assembly 30.

Figure 4:
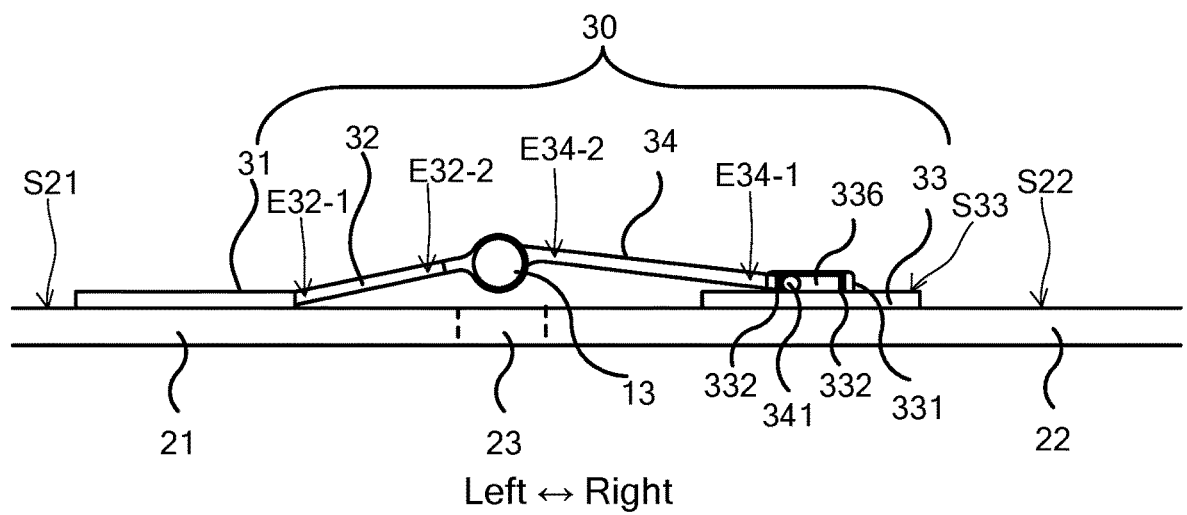
FIG. 4 is a side view of a fixing assembly, in accordance with some embodiments.
Figure 5:
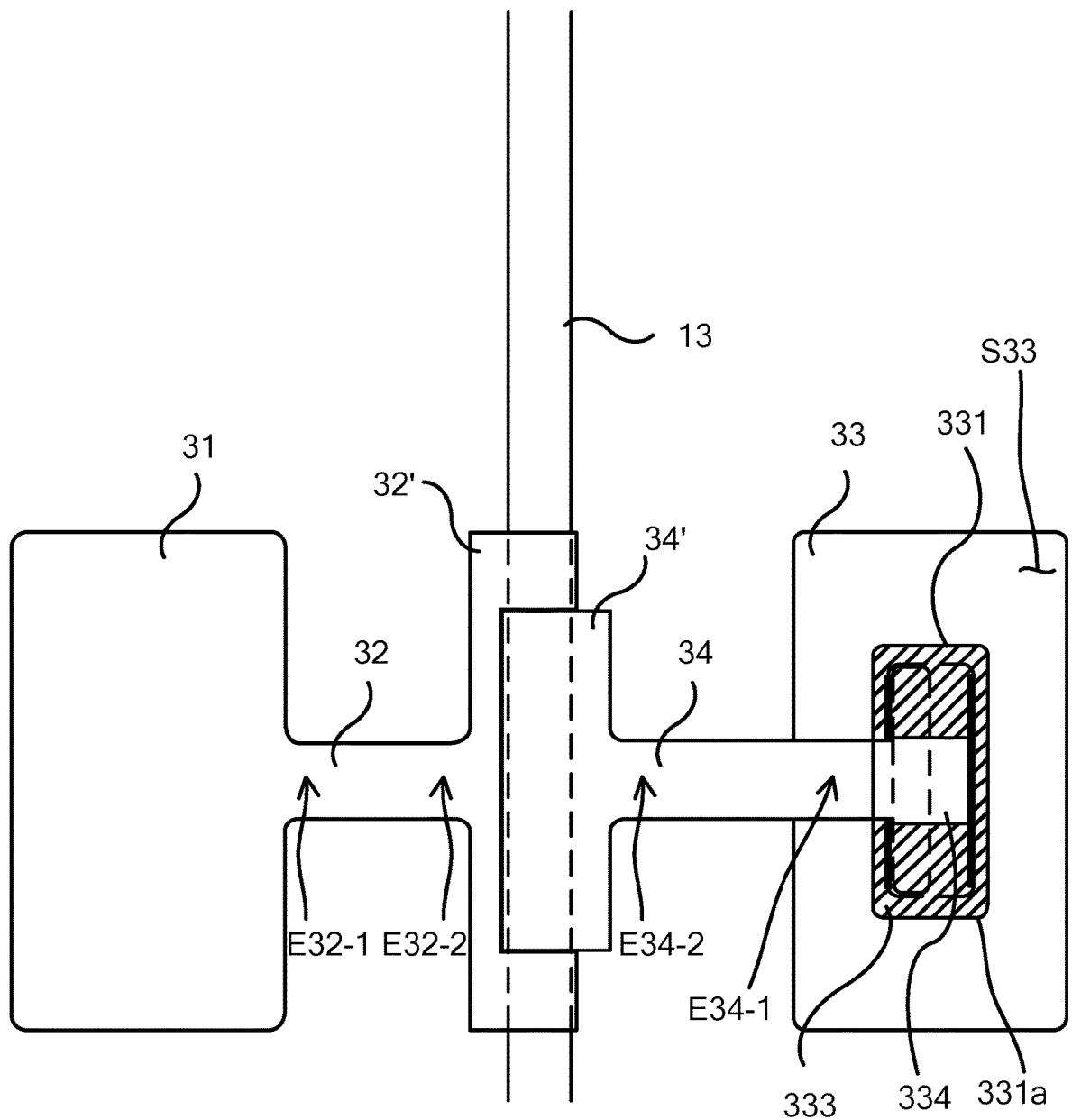
FIG. 5 is a front view of a fixing assembly, in accordance with some embodiments.

In some embodiments, as shown in FIGS. 4 and 5, the fixing assembly 30 includes a first fixing seat 31, a first connecting rod 32, a second fixing seat 33, and a second connecting rod 34.

As shown in FIGS. 2, 4 and 5, the first fixing seat 31 is fixed on a side S21 of the first non-bendable portion 21 proximate to the first sub-housing 11. One end E32-1 of the first connecting rod 32 is fixedly connected to the first fixing seat 31, and the other end E32-2 of the first connecting rod 32 is rotatably connected to the rotating shaft 13. For example, as shown in FIGS. 4 and 5, the end E32-2 of the first connecting rod 32 connected to the rotating shaft 13 is fixedly connected to a shaft sleeve 32'. The shaft sleeve 32' is sleeved on the rotating shaft 13. The first connecting rod 32 can rotate around the rotating shaft 13 through the shaft sleeve 32'.

In addition, as shown in FIG. 4, the second fixing seat 33 is fixed on a side S322 of the second non-bendable portion 22 proximate to the second sub-housing 12. One end E34-1 of the second connecting rod 34 is slidably connected to the second fixing seat 33, and the other end E34-2 of the second connecting rod 34 is rotatably connected to the rotating shaft 13. For example, in some embodiments, as shown in FIGS. 4 and 5, the end E34-2 of the second connecting rod 34 connected to the rotating shaft 13 is fixedly connected to another shaft sleeve 34'. The rotating shaft sleeve 34' is sleeved on the rotating shaft 13. The second connecting rod 34 can rotate around the rotating shaft 13 through the shaft sleeve 34'.

FIGS. 4 and 5 show that the end E32-1 of the first connecting rod 32 is fixedly connected to the first fixing seat 31, and the end E34-1 of the second connecting rod 34 is slidably connected to the second fixing seat 33. However, it can be understood that in some other embodiments, one end of the first connecting rod 32 may be slidably connected to the first fixing seat 31, and one end of the second connecting rod 34 may be fixedly connected to the second fixing seat 33; or, one end of the first connecting rod 32 is slidably connected to the first fixing seat 31, and one end of the second connecting rod 34 is slidably connected to the second fixing seat 33.

It will be noted that the first fixing seat 31 and the second fixing seat 33 may be fixed to the first non-bendable portion 21 and the second non-bendable portion 22 of the display panel 20 by means of adhesive bonding, respectively, for example, by means of strong double-sided adhesive bonding. The strong double-sided adhesive bonding has the advantages of simple operation, low cost, and good fixing effect. In some embodiments, in order to improve strength of the display panel 20, steel sheets are bonded to the side of the display panel 20 proximate to the housing 10. In this case, the first fixing seat 31 and the second fixing seat 33 are bonded to a steel sheet on the first non-bendable portion 21 and a steel sheet on the second non-bendable portion 22, respectively.

In the fixing assembly 30 provided by the embodiments of the present disclosure, one end of the second connecting rod 34 can rotate around the rotating shaft 13. In this way, during a process of folding and unfolding the housing 10, the second sub-housing 12 can rotate around the rotating shaft 13. As a result, the second non-bendable portion 22 can also rotate around the rotating shaft 13 through the second connecting rod 34, so that the display panel 20 can also be fold and unfold. Moreover, the other end of the second connecting rod 34 is slidably connected to the second fixing seat 33. Therefore, during the process of folding and unfolding the housing 10, the display panel 20 may be ensured to bend along the bendable portion 23, so as to avoid a large deformation of the display panel 20. In addition, the second fixing seat 33 and the second connecting rod 34 may also support and fix the second non-bendable portion 22 so as to keep the second non-bendable portion 22 stable during a folding and bending process. In other words, the fixing assembly 30 enables the display panel 20 to follow movement of the housing 10 smoothly.

In addition, the first connecting rod 32 can rotate around the rotating shaft 13, which will not affect the first non-bendable portion 21 during the process of rotating the second non-bendable portion 22.

It will be noted that beneficial effects of slidably connecting one end of the first connecting rod 32 to the first fixing seat 31 on the display panel 20 and the first non-bendable portion 21 are similar to the above, and will not be repeated here.

In some embodiments, in order to enable the second connecting rod 34 to slide on the second fixing seat 33, as shown in FIGS. 4 and 5, the fixing assembly 30 further includes a sliding frame 331. The sliding frame 331 is disposed on a surface S33 of the second fixing seat 33 proximate to the second sub-housing 12. The sliding frame 331 includes a plurality of sidewalls 331a. The plurality of sidewalls 331a are connected end to end in sequence to form the sliding frame 331 with a cavity 336. A sliding block 341 is provided at the end E34-1 of the second connecting rod 34 connected to the second fixing seat 33. The sliding block 341 is disposed in the cavity 336. The sliding block 341 is configured to move in the sliding frame 331 during a process of rotating the second non-bendable portion 22, that is, during a process of the display panel 20 from a fully unfolded state to a folded state or from a folded state to a fully unfolding state. In some embodiments, the sliding block 341 is in a shape of a cuboid, or the sliding block 341 is in a shape of a cylinder. The embodiments of the present disclosure does not limit a specific shape of the sliding block 341, as long as the sliding block 341 may slide stably in the sliding frame 331.

In addition, in order to enable the sliding block 341 to move in the sliding frame 331, a width of the sliding frame 331 is greater than a width of the sliding block 341 in a sliding direction of the sliding block 341 (i.e., the left-right direction in FIG. 4).

Figure 6:
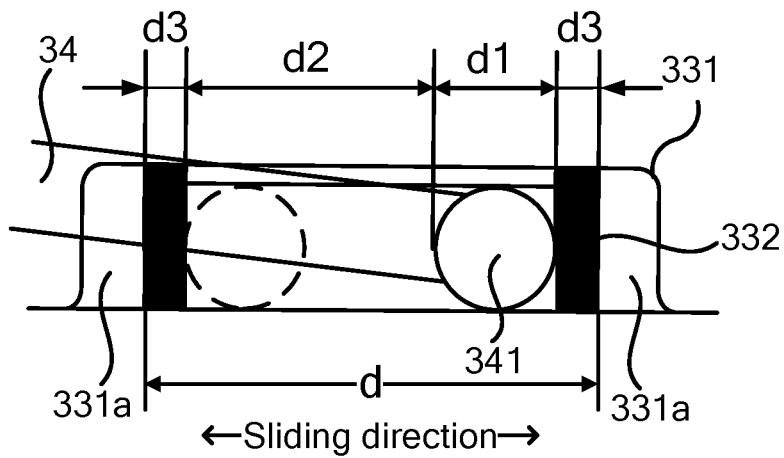
FIG. 6 is a diagram showing a sliding frame of a fixing assembly, in accordance with some embodiments.

In order to further enhance structural stability of the fixing assembly 30, as shown in FIGS. 4 and 6, magnetic films 332 are disposed on two sidewalls inside the sliding frame 331 in the sliding direction of the sliding block 341. In this case, a material of the sliding block 341 may be a material that can be adsorbed by the magnetic films 332. For example, the material of the sliding block 341 may be an iron alloy material, or the sliding block 341 may be subjected to magnetic treatment, so that the magnetic films 332 have attraction force on the sliding block 341. In this way, when the foldable display apparatus is in a fully unfolded state or folded state, the magnetic films 332 can generate the attraction force on the sliding block 341. As a result, the second connecting rod 34 connected to the sliding block 341 has a good stable ability to maintain a current state, and thus stability of the fixing assembly 30 is maintained. In addition, the sliding block 341 moves during the folding process, and the attraction force of magnetic films 332 on the sliding block 341 generates a damping feeling, which is fed back to an user, thereby improving the user experience.

In some embodiments, as shown in FIG. 6, the width of the sliding block 341 in the sliding direction thereof is d1. During the process of rotating the second non-bendable portion 22 (i.e., during a process of the display panel 20 from the fully unfolded state to the folded state or from the folded state to the fully unfolded state), a distance that the sliding block 341 moves in the sliding frame 331 in the sliding direction thereof is d2. A width of the magnetic film 332 in the sliding direction of the sliding block 341 is d3.

Figure 7:
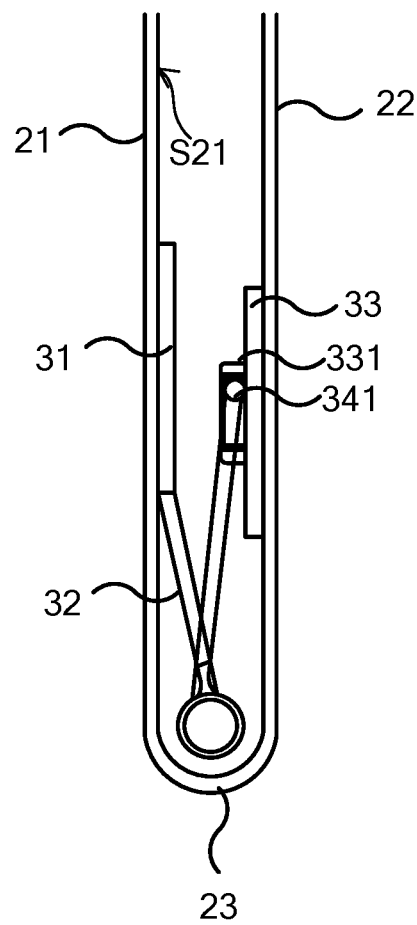
FIG. 7 is a diagram showing a folded state of a foldable display apparatus, in accordance with some embodiments.

On this basis, a width of the cavity 336 in the sliding direction of the sliding block 341 is d, and d is equal to a sum of d1, d2, and twice d3 (d=d1+d2+2×d3). In this way, when the second non-bendable portion 22 does not rotate (that is, the display panel 20 is in the fully unfolded state), as shown in FIG. 4, the sliding block 341 is located at the magnetic film 332 on a side of the sliding frame 331 proximate to the rotating shaft 13. When the second non-bendable portion 22 is located at the side S21 of the first non-bendable portion 21 after rotating (that is, the display panel 20 is in the folded state), as shown in FIG. 7, the sliding block 341 is located at the magnetic film 332 on a side of the sliding frame 331 away from the rotating shaft 13. In this way, it may be ensured that the display panel is bent along the bendable portion 23 during the process of folding the display apparatus, so as to avoid large deformation of the display panel.

In some embodiments, the magnetic films 332 may also be omitted. In this case, the width d of the cavity 336 is equal to a sum of d1 and d2 (d=d1+d2).

On this basis, in order to enable the sliding block 341 to slide stably in the sliding frame 331, and to prevent the sliding block 341 from falling out of the sliding frame 331 during a sliding process, as shown in FIG. 5, an upper portion of the sliding frame 331 is further provided with an upper cover 333.

In addition, in order not to hinder a movement of the second connecting rod 34 in the sliding direction of the sliding block 341, as shown in FIG. 5, the upper cover 333 is provided with an opening 334. During a movement of the sliding block 341 in the sliding frame 331 in the sliding direction of the sliding block 341, the second connecting rod 34 can move in the opening 334 along the sliding direction of the sliding block 341, so as to avoid hindering the folding and unfolding.

In an example, when a foldable display terminal is unfolded from a folded state, as shown in FIG. 1, a bendable region of the display panel 20 is prone to bulge.

The foldable display apparatus provided by some embodiments of the present disclosure, as shown in FIGS. 9A and 11A, further includes one or more stretching assemblies 01. Stretching assembly(s) 01 are fixed to the second non-bendable portion 22 and the second sub-housing 12. The stretching assembly(s) 01 are configured to apply force directed from the first non-bendable portion 21 to the second non-bendable portion 22 to the second non-bendable portion 22 when the second non-bendable portion 22 rotates toward the first non-bendable portion 21 to approximately align the second non-bendable portion 22 with the first non-bendable portion 21. In this way, when the foldable display apparatus is unfolded from the folded state, the stretching assembly(s) 01 apply the force directed from the first non-bendable portion 21 to the second non-bendable portion 22 to the second non-bendable portion 22. As a result, the second non-bendable portion 22 moves in a direction away from the first non-bendable portion 21, and drives the bendable portion 23 to move in the direction away from the first non-bendable portion 21, and thus the bulge of the bendable portion 23 is unfolded under the force applied by the stretching assembly(s) 01.

It will be noted that FIGS. 9A and 11A are illustrated by taking an example in which the stretching assembly(s) 01 are fixed to the second non-bendable portion 22 and the second sub-housing 12. In some embodiments, other stretching assembly(s) 01 are disposed on the first non-bendable portion 21 and the first sub-housing 11. The stretching assembly(s) 01 are configured to apply force directed from the second non-bendable portion 22 to the first non-bendable portion 21 to the first non-bendable portion 21 when the foldable display apparatus is unfolded from the folded state.

In a case where the foldable display apparatus includes a plurality of stretching assemblies 01, the plurality of stretching assemblies 01 may all be disposed on the first non-bendable portion 21 and the first sub-housing 11, or may all be disposed on the second non-bendable portion 22 and the second sub-housing 12; or, a part of the plurality of stretching assemblies 01 are disposed on the first non-bendable portion 21 and the first sub-housing 11, and another part of the plurality of stretching assemblies 01 are disposed on the second non-bendable portion 22 and the second sub-housing 12.

It will be noted that the second non-bendable portion 22, the bendable portion 23 and the first non-bendable portion 21 moving under the force applied by the stretching assemblies 01 may mean that these three have obvious position changes, and may also mean deformation of these three.

It can be seen from the foregoing that the foldable display apparatus provided by some embodiments of the present disclosure includes the housing 10. The housing 10 fixes and protects the display panel 20, and can be folded and unfolded. The foldable display apparatus further includes the fixing assembly 30. The fixing assembly 30 can fix and support the display panel 20. Furthermore, the fixing assembly 30 may ensure that the display panel is bent along the bendable portion 23 during the process of folding the display apparatus so as to avoid the large deformation of the display panel, and ensure the followability of the display panel 20 to the movement of the housing 10. In addition, the foldable display apparatus further includes the stretching assembly 01. The stretching assembly 01 can apply the force directed from the first non-bendable portion 21 to the second non-bendable portion 22 to the second non-bendable portion 22 when the foldable display apparatus is unfolded from the folded state, so that the second non-bendable portion 22 drives the bendable portion 23 to move in the direction away from the first non-bendable portion 21, and the bendable portion 23 is fully unfolded.

A specific structure of the stretching assembly 01 will be described in detail below.

In some embodiments, as shown in FIGS. 8A-1, 8B, and 8C, the stretching assembly 01 includes a spring 40. One end E40-1 of the spring 40 is fixed on a side S22 of the second non-bendable portion 22 proximate to the second sub-housing 12, and the other end E40-2 of the spring 40 is fixed on a side S12 of the second sub-housing 12 proximate to the second non-bendable portion 22.

When the foldable display apparatus is in the folded state, the spring 40 is in a naturally straight state. When the foldable display apparatus is unfolded from the fold state, the end of the spring 40 fixed to the second sub-housing 12 moves a certain distance along with the second sub-housing 12 in a direction perpendicular to the rotating shaft 13 and toward the second non-bendable portion 22 (e.g., the X direction in FIG. 8A-1). In this case, the display panel 20 is in a bulged state at the bendable portion 23 and is not fully unfolded, and the end of the spring 40 fixed to the second non-bendable portion 22 does not move in the X direction. In this case, the spring 40 is in an unnaturally straight state, and applies elastic force to the second non-bendable portion 22 in the X direction, so that the second non-bendable portion 22 moves in the X direction, and thus the display panel 20 is further unfolded.

In some embodiments, the fixing assembly may also be omitted. On this basis, when the foldable display apparatus is in the unfolded state, the spring 40 may be in the naturally straight state.

When the foldable display apparatus is in the folded state, it can be seen from a situation shown in FIG. 7 that the display panel 20 is located on an outside of the housing 10, and the bendable portion 23 of the display panel 20 is stretched. Since the bendable portion 23 is stretched, the bendable portion 23 applies elastic force to the second non-bendable portion 22. As a result, the second non-bendable portion 22 moves toward the first non-bendable portion 21. In this case, the spring 40 is in the unnaturally straight state. When the foldable display apparatus is unfolded from the folded state, the spring 40 in the unnaturally straight state returns to its original shape, and thus applies the elastic force to the second non-bendable portion 22 in the X direction. As a result, the second non-bendable portion 22 moves in the X direction, the display panel 20 is unfolded, and the display panel 20 is prevented from being in the bulged state at the bendable portion 23.

Figures 1, 8A:
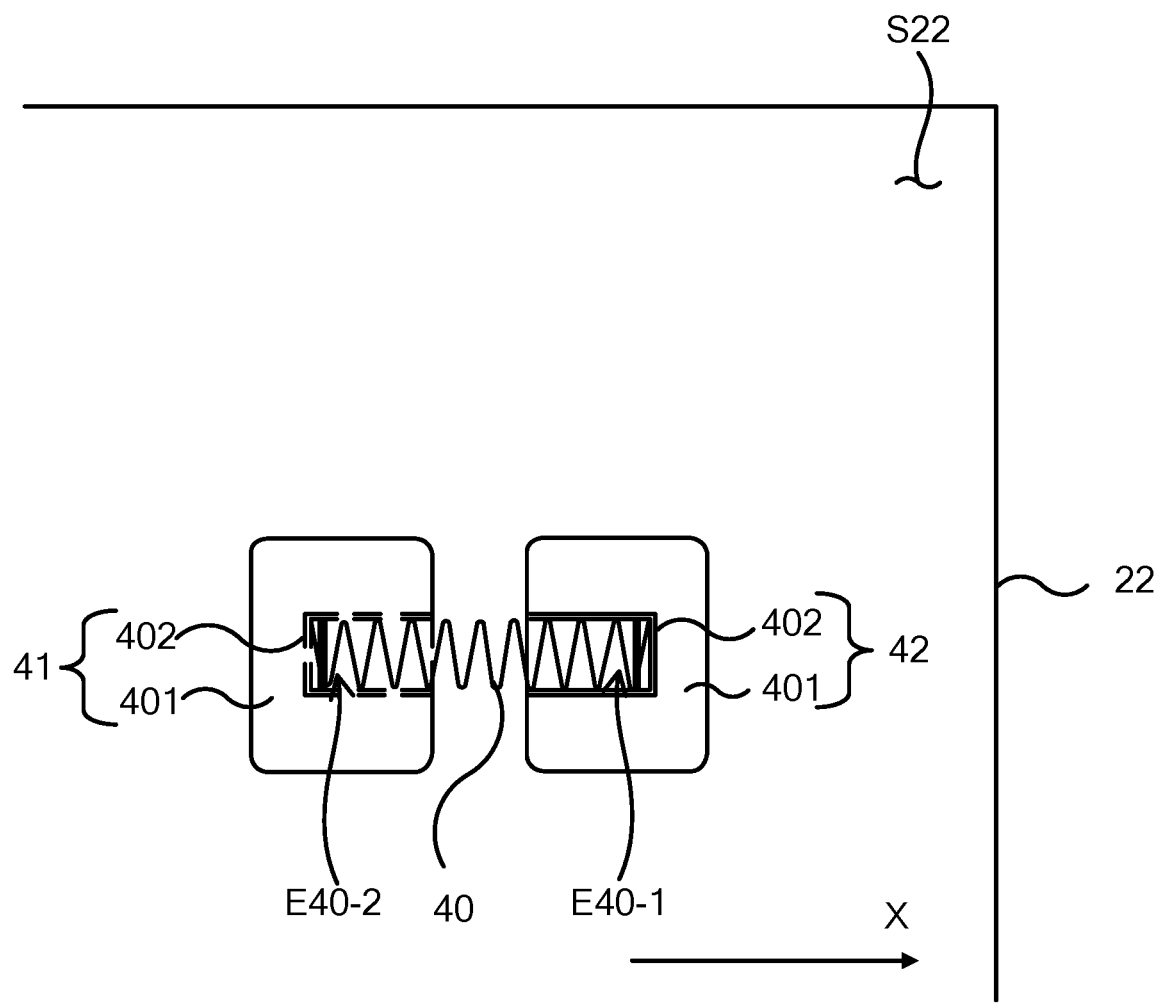
Figures 2, 8A:
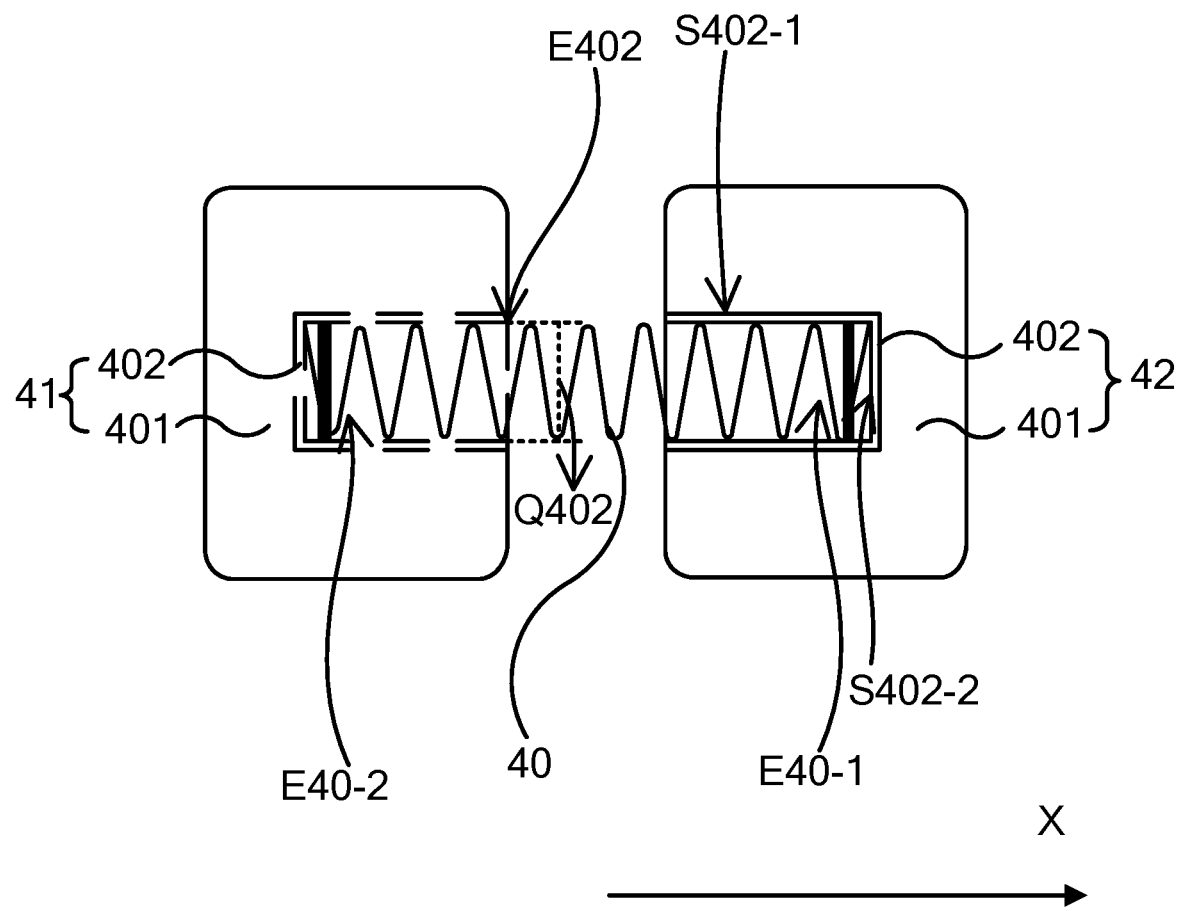
Figure 8B:
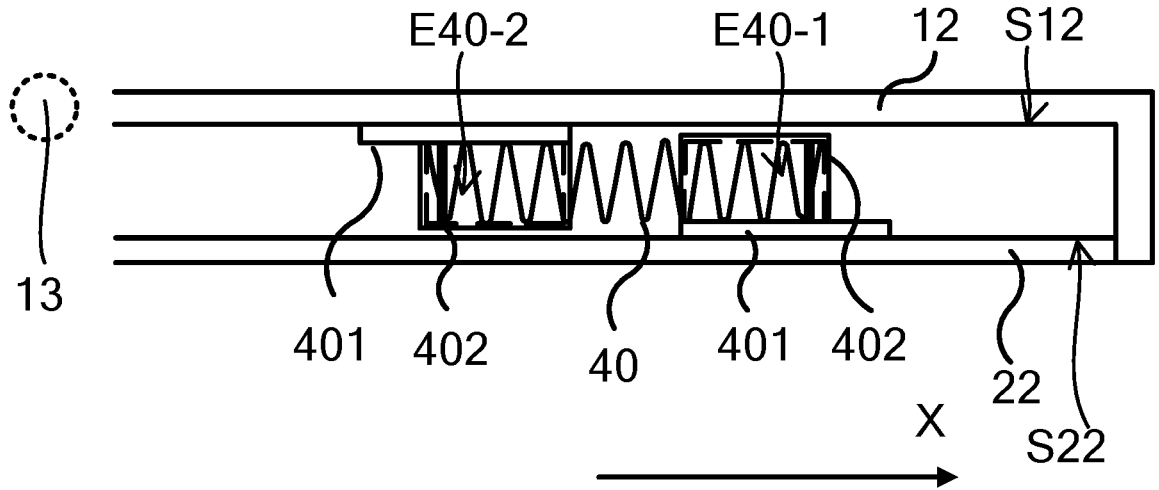
FIG. 8B is a side view of a spring stretching assembly, in accordance with some embodiments.
Figure 8C:
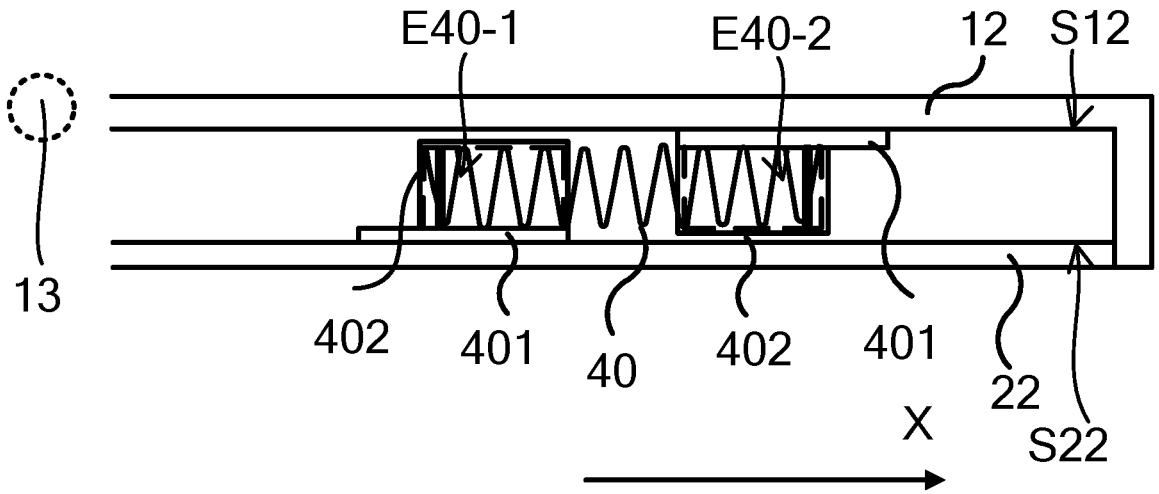
FIG. 8C is a side view of another spring stretching assembly, in accordance with some embodiments.

It will be noted that, as shown in FIG. 8B, the end E40-2 of the spring 40 fixed to the second sub-housing 12 may be located proximate to the rotating shaft 13, and the end E40-1 of the spring 40 fixed to the second non-bendable portion 22 may be located away from the rotating shaft 13. Here, the rotating shaft 13 is represented by the dashed circle in FIG. 8B. In this way, when the foldable display apparatus is unfolded, the spring 40 in a compressed state generates the elastic force. The elastic force pushes the second non-bendable portion 22 to move in the X direction. Or, as shown in FIG. 8C, the end E40-2 of the spring 40 fixed to the second sub-housing 12 may be located away from the rotating shaft 13, and the end E40-1 of the spring 40 fixed to the second non-bendable portion 22 may be located proximate to the rotating shaft 13. Here, the rotating shaft 13 is represented by the dashed circle in FIG. 8C. In this way, when the foldable display apparatus is unfolded, the spring 40 in a stretched state generates the elastic force. The elastic force pulls the second non-bendable portion 22 to move in the X direction. For convenience of description, a description may be made below by taking an example in which the end of the spring 40 fixed to the second sub-housing 12 is a side of the spring 40 proximate to the rotating shaft 13 and the end of the spring 40 fixed to the second non-bendable portion 22 is a side of the spring 40 away from the rotating shaft 13.

In some embodiments, in order to stabilize the spring 40, as shown in FIG. 8A-1, the stretching assembly 01 further includes a first spring fixing support 41 and a second spring fixing support 42. As shown in FIG. 8A-2, first spring fixing support 41 and the second spring fixing support 42 each include a base 401 and a sleeve 402. One end E402 of the sleeve 402 has an opening Q402. An outer sidewall S402-1 of the sleeve 402 is fixed on the base 401. A cross-section of the sleeve 402 perpendicular to its extension may be in a shape of a rectangle or round, and may be in the shape of the rectangle in order to be easily fixed on the base 401. The embodiments of the present disclosure does not limit the shape of the sleeve 402, as long as the sleeve 402 may accommodate the end of the spring 40 and may be stably fixed on the base 401.

As shown in FIG. 8B, the base 401 of the first spring fixing support 41 is fixed on a side S12 of the second sub-housing 12 proximate to the second non-bendable portion 22. The base 401 of the second spring fixing support 42 is fixed on a side S22 of the second non-bendable portion 22 proximate to the second sub-housing 12. The first spring fixing support 41 and the second spring fixing support 42 may be fixed to the second sub-housing 12 and the second non-bendable portion 22 by means of adhesive bonding, respectively, for example, by means of strong double-sided adhesive bonding. In addition, in some embodiments, a steel sheet is bonded to the side of the display panel 20 proximate to the housing 10. In this case, the base 401 of the second spring fixing support 42 is fixed on the steel sheet.

In addition, as shown in FIG. 8A-2, the opening Q402 of the sleeve 402 of the first spring fixing support 41 and the opening Q402 of the sleeve 402 of the second spring fixing support 42 are disposed opposite to each other in a direction perpendicular to the rotating shaft 13 (parallel to the X direction in FIG. 8A-2). One end E40-2 of the spring 40 passes through the opening Q402 of the sleeve 402 of the first spring fixing support 41 and is fixed on an inner wall S402-2 of the sleeve 402 of the first spring fixing support 41. The other end E40-1 of the spring 40 passes through the opening Q402 of the sleeve 402 of the second spring fixing support 42 and is fixed on an inner wall S402-2 of the sleeve 402 of the second spring fixing support 42.

On this basis, in order to stabilize the spring 40 and prevent accidental ejection of the spring 40 during use, the spring 40 may be fixed on the inner wall of the sleeve 402 by screws or clips.

Figure 9B:
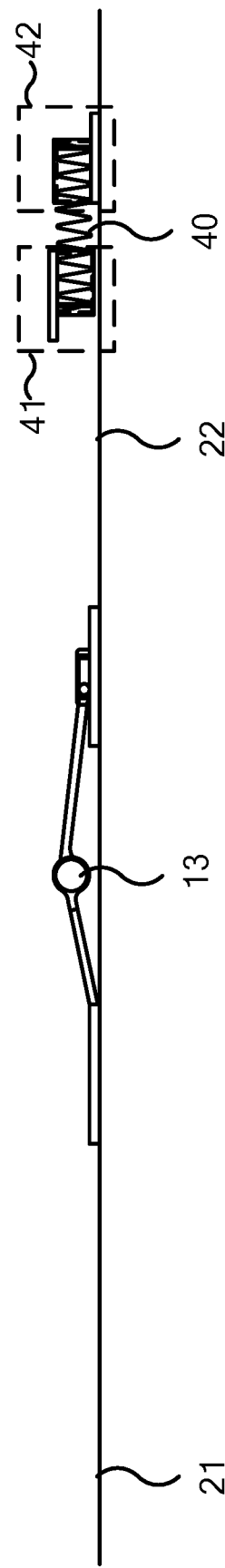
FIG. 9B is a side view of a foldable display apparatus, in accordance with some embodiments.

The above is illustrated by taking one fixing assembly and one stretching assembly as an example. The fixing assemblies and the stretching assemblies provided by some embodiments of the present disclosure are disposed on the display panel as shown in FIGS. 9A and 9B, and FIG. 9B is a side view of FIG. 9A. As shown in FIG. 9A, the foldable display apparatus may include a plurality of fixing assemblies 30 and a plurality of stretching assemblies 01. The embodiments of the present disclosure does not limit the number of the fixing assemblies 30 and the number of the stretching assemblies 01 of the foldable display apparatus, as long as the display panel may be stably fixed and may be fully unfolded.

Figure 10A:
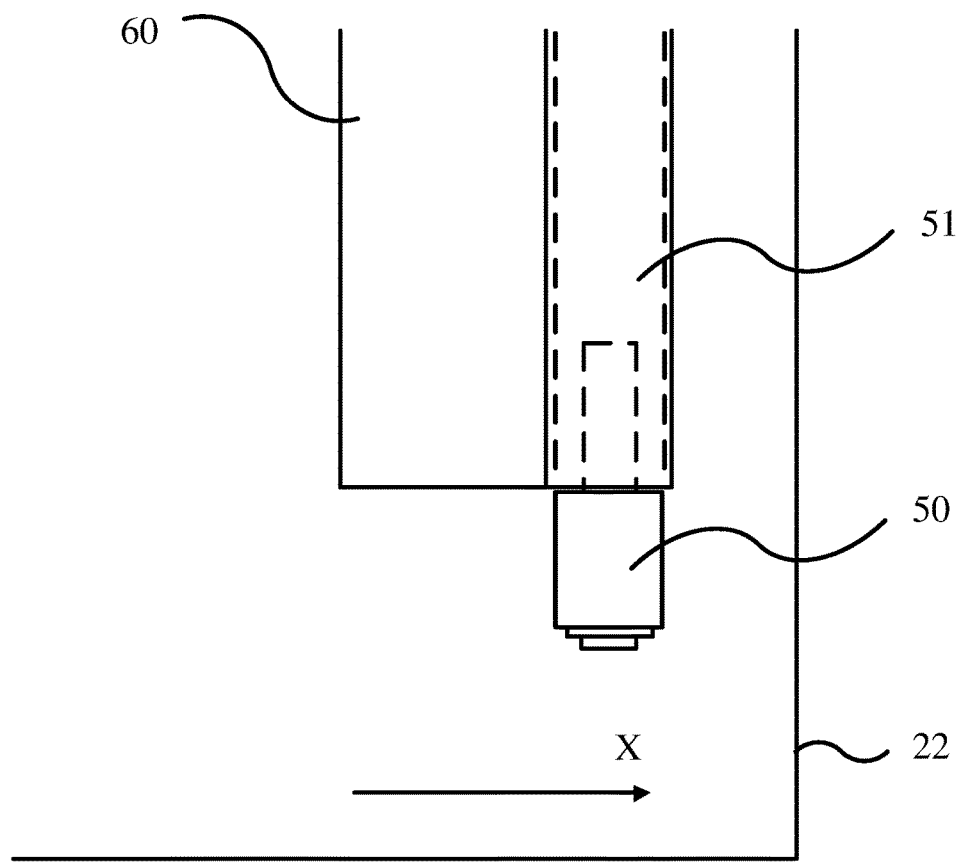
FIG. 10A is a front view of a micro-motor, in accordance with some embodiments.
Figure 10B:
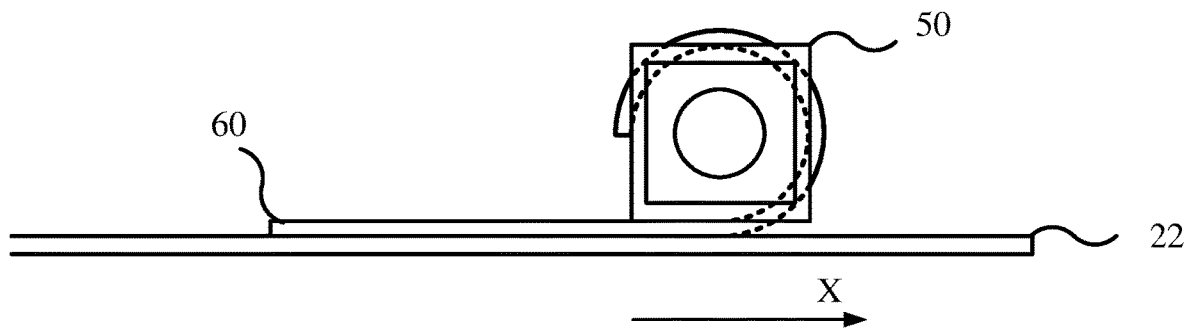
FIG. 10B is a side view of a micro-motor, in accordance with some embodiments.

The stretching assembly 01 may also have other implementations. For example, in some embodiments, as shown in FIGS. 10A and 10B, the stretching assembly 01 includes a micro-motor 50. The micro-motor 50 is fixed on a side of the second sub-housing 12 proximate to the second non-bendable portion 22. For example, the micro-motor 50 may be fixed to the second sub-housing 12 by means of screw, glue bonding, strong double-sided adhesive bonding, etc. The embodiments of the present disclosure does not limit the manner of fixing the micro-motor 50, as long as the micro-motor 50 may be stably fixed to the second sub-housing 12. It will be noted that a size of the micro-motor 50 is sufficient to enable the micro-motor to be installed between the housing 10 and the display panel 20.

In order to enable the micro-motor 50 to generate pulling force on the second non-bendable portion 22, as shown in FIGS. 10A and 10B, the stretching assembly 01 further includes a flexible sheet 60. For example, the flexible sheet 60 may be made of polyethylene terephthalate (PET), polyimide (PI), or the like. As shown in FIGS. 10A and 10B, one end of the flexible sheet 60 is fixed on a side of the second non-bendable portion 22 proximate to the second sub-housing 12. An opposite end of the flexible sheet 60 is fixed on a rotating shaft 51 of the micro-motor 50.

In this way, when the foldable display apparatus is unfolded from the folded state, the flexible sheet 60 may wind around the rotating shaft 51 of the micro-motor 50 by controlling the rotating shaft 51 of the micro-motor 50 to rotate a certain angle. As a result, pulling force that is perpendicular to the rotating shaft 13 and directed from the first non-bendable portion 21 to the second non-bendable portion 22 is applied to the second non-bendable portion 22, so as to drive the display panel 20 to be further unfolded and improve the bulge.

It will be noted that, in order to ensure that when the rotating shaft 51 of the micro-motor 50 rotates, the flexible sheet 60 applies the stable pulling force directed from the first non-bendable portion 21 to the second non-bendable portion 22 to the second non-bendable portion 22, a position where the flexible sheet 60 is fixed to the second non-bendable portion 22 is closer to the rotating shaft 13 than the micro-motor 50.

On this basis, in order to facilitate a user to control the micro-motor 50, in some embodiments, the foldable display apparatus is provided with a control button to control the rotation of the micro-motor 50. For example, when the foldable display apparatus is unfolded from the folded state, the user may control the rotating shaft 51 of the micro-motor 50 to rotate a certain angle in the first direction through the control button. For example, as shown in FIG. 10B, the rotating shaft 51 of the micro-motor 50 rotates counterclockwise to a certain angle, so that the flexible sheet 60 winds around the rotating shaft of the micro-motor 50, and applies the pulling force to the second non-bendable portion 22 to make the display panel further unfolded. When the foldable display apparatus is folded from the unfolded state, the control button controls the rotating shaft 51 of the micro-motor 50 to rotate a certain angle in a direction opposite to the first direction (for example, clockwise), so that the flexible sheet 60 unwinds (no longer winding).

In addition, when the foldable display apparatus is in the folded state, the micro-motor 50 may be in a locked state. In this way, user experience may be improved, and the foldable display apparatus may be more stable.

In some embodiments, the rotating shaft 51 of the micro-motor 50 may wind or unwind the flexible sheet 60 according to a predetermined step length. Each time the user presses the control button, the rotating shaft 51 of the micro-motor 50 rotates forward or backward by an angle of one step length. Correspondingly, the second non-bendable portion 22 moves a distance of one step length. For example, when the foldable display apparatus is unfolded from the folded state, the user presses the control button once, and the second non-bendable portion 22 moves one step length to right, for example, 1 mm.

According to a relationship between a rotation angle of the rotating shaft 51 of the micro-motor 50 and a distance moved by the second non-bendable portion 22, an angle at which the rotating shaft 51 of the micro-motor 50 needs to rotate when the second non-bendable portion 22 moves one step length may be calculated. Correspondingly, when the user presses the control button once, the rotating shaft 51 of the micro-motor 50 rotates the angle counterclockwise, so that the second non-bendable portion 22 gradually moves to the right to avoid damage to the display panel 20 caused by an excessive moving distance of the second non-bendable portion 22.

Figure 11B:
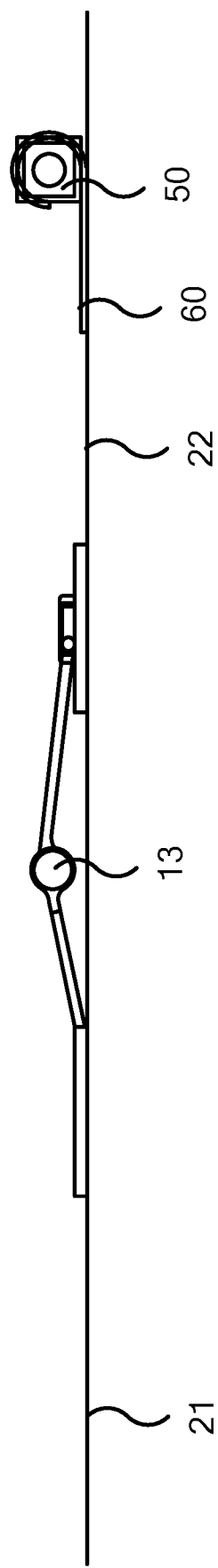
FIG. 11B is a side view of another foldable display apparatus, in accordance with some embodiments.

An arrangement of the stretching assembly and the fixing assemblies on the display panel is shown in FIGS. 11A and 11B, and FIG. 11B is a side view of FIG. 11A. It will be noted that the figures show an example in which one micro-motor 50 and one flexible sheet 60 are disposed on the display panel. An arrangement of the micro-motor 50 and the flexible sheet 60 in the embodiments of the present disclosure is not limited thereto. For example, a plurality of micro-motors 50 and a plurality of flexible sheets 60 may also be disposed in a direction parallel to the rotating shaft 13. In some embodiments, the fixing assembly may also be omitted.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A foldable display apparatus, comprising:
    a housing including a first sub-housing, a second sub-housing and a rotating shaft, the first sub-housing and the second sub-housing being rotatably connected through the rotating shaft;
    a display panel including a bendable portion, and a first non-bendable portion and a second non-bendable portion being respectively located on two sides of the bendable portion; the first non-bendable portion being accommodated in the first sub-housing, the second non-bendable portion being accommodated in the second sub-housing, and the bendable portion corresponding to the rotating shaft between the first sub-housing and the second sub-housing;
    one or more stretching assemblies, at least one stretching assembly in the one or more stretching assemblies being fixed to the second non-bendable portion and the second sub-housing, the at least one stretching assembly being configured to apply force directed from the first non-bendable portion to the second non-bendable portion when the foldable display apparatus is unfolded from a fold state; and
    at least one fixing assembly, the at least one fixing assembly including:
        a first fixing seat fixed on a side of the first non-bendable portion proximate to the first sub-housing;
        a first connecting rod, one end of the first connecting rod being fixedly connected to the first fixing seat, and another end of the first connecting rod being rotatably connected to the rotating shaft;
        a second fixing seat fixed on a side of the second non-bendable portion proximate to the second sub-housing; and
        a second connecting rod, one end of the second connecting rod being slidably connected to the second fixing seat, and another end of the second connecting rod being rotatably connected to the rotating shaft.

2. The foldable display apparatus according to claim 1, wherein the one or more stretching assemblies include a plurality of stretching assemblies; wherein
    a part of the plurality of stretching assemblies are fixed to the first non-bendable portion and the first sub-housing, and configured to apply force directed from the second non-bendable portion to the first non-bendable portion when the foldable display apparatus is unfolded from a folded state.

3. The foldable display apparatus according to claim 2, further comprising at least one fixing assembly, the at least one fixing assembly including:
    a first fixing seat fixed on a side of the first non-bendable portion proximate to the first sub-housing;
    a first connecting rod, one end of the first connecting rod being fixedly connected to the first fixing seat, and another end of the first connecting rod being rotatably connected to the rotating shaft;
    a second fixing seat fixed on a side of the second non-bendable portion proximate to the second sub-housing; and
    a second connecting rod, one end of the second connecting rod being slidably connected to the second fixing seat, and another end of the second connecting rod being rotatably connected to the rotating shaft.

4. A foldable display apparatus, comprising:
    a housing including a first sub-housing, a second sub-housing and a rotating shaft, the first sub-housing and the second sub-housing being rotatably connected through the rotating shaft;
    a display panel including a bendable portion, and a first non-bendable portion and a second non-bendable portion being respectively located on two sides of the bendable portion; the first non-bendable portion being accommodated in the first sub-housing, the second non-bendable portion being accommodated in the second sub-housing, and the bendable portion corresponding to the rotating shaft between the first sub-housing and the second sub-housing; and
    one or more stretching assemblies, at least one stretching assembly in the one or more stretching assemblies being fixed to the second non-bendable portion and the second sub-housing, the at least one stretching assembly being configured to apply force directed from the first non-bendable portion to the second non-bendable portion when the foldable display apparatus is unfolded from a fold state, wherein the stretching assembly includes:
        a spring, one end of the spring being fixed on a side of the second non-bendable portion proximate to the second sub-housing, and another end of the spring being fixed on a side of the second sub-housing proximate to the second non-bendable portion.

5. The foldable display apparatus according to claim 4, wherein the end of the spring fixed to the second sub-housing is closer to the rotating shaft than the end of the spring fixed to the second non-bendable portion.

6. The foldable display apparatus according to claim 4, wherein the end of the spring fixed to the second sub-housing is farther away from the rotating shaft than the end of the spring fixed to the second non-bendable portion.

7. The foldable display apparatus according to claim 1, wherein the stretching assembly includes:
    a spring, one end of the spring being fixed on the side of the second non-bendable portion proximate to the second sub-housing, and another end of the spring being fixed on a side of the second sub-housing proximate to the second non-bendable portion.

8. The foldable display apparatus according to claim 7, wherein the end of the spring fixed to the second sub-housing is closer to the rotating shaft than the end of the spring fixed to the second non-bendable portion.

9. The foldable display apparatus according to claim 7, wherein the end of the spring fixed to the second sub-housing is farther away from the rotating shaft than the end of the spring fixed to the second non-bendable portion.

10. The foldable display apparatus according to claim 4, wherein the stretching assembly further includes: a first spring fixing support and a second spring fixing support; wherein the first spring fixing support and second spring fixing support each include a base and a sleeve, one end of the sleeve has an opening, and an outer sidewall of the sleeve is fixed on the base;

the base of the first spring fixing support is fixed on the side of the second sub-housing proximate to the second non-bendable portion;

the base of the second spring fixing support is fixed on the side of the second non-bendable portion proximate to the second sub-housing;

the opening of the sleeve of the first spring fixing support and the opening of the sleeve of the second spring fixing support are disposed opposite to each other in a direction perpendicular to an axial direction of the rotating shaft; and one end of the spring passes through the opening of the sleeve of the first spring fixing support and is fixed on an inner wall of the sleeve of the first spring fixing support, and another end of the spring passes through the opening of the sleeve of the second spring fixing support and is fixed on an inner wall of the sleeve of the second spring fixing support.

11. A foldable display apparatus, comprising:

a housing including a first sub-housing, a second sub-housing and a rotating shaft, the first sub-housing and the second sub-housing being rotatably connected through the rotating shaft;

a display panel including a bendable portion, and a first non-bendable portion and a second non-bendable portion being respectively located on two sides of the bendable portion; the first non-bendable portion being accommodated in the first sub-housing, the second non-bendable portion being accommodated in the second sub-housing, and the bendable portion corresponding to the rotating shaft between the first sub-housing and the second sub-housing; and one or more stretching assemblies, at least one stretching assembly in the one or more stretching assemblies being fixed to the second non-bendable portion and the second sub-housing, the at least one stretching assembly being configured to apply force directed from the first non-bendable portion to the second non-bendable portion when the foldable display apparatus is unfolded from a fold state, wherein the stretching assembly includes:

a micro-motor fixed on a side of the second sub-housing proximate to the second non-bendable portion; and a flexible sheet configured to be windable on a rotating shaft of the micro-motor, one end of the flexible sheet being fixed on a side of the second non-bendable portion proximate to the second sub-housing, and being closer to the rotating shaft of the housing than the micro-motor, and another opposite end of the flexible sheet being fixed on the rotating shaft of the micro-motor.

12. The foldable display apparatus according to claim 11, wherein a size of the micro-motor is sufficient to enable the micro-motor to be installed between the housing and the display panel.

13. The foldable display apparatus according to claim 11, wherein a material of the flexible sheet is at least one of polyimide or polyethylene terephthalate.

14. The foldable display apparatus according to claim 1, wherein the at least one fixing assembly further includes a sliding frame and a sliding block; wherein the sliding frame is disposed on a surface of the second fixing seat proximate to the second sub-housing, the sliding frame includes a plurality of sidewalls, and the plurality of sidewalls are connected end to end in sequence to form a cavity;

the sliding block is disposed at the end of the second connecting rod connected to the second fixing seat and is located in the cavity, and the sliding block is configured to be moveable in the sliding frame; and a width of the sliding frame is greater than a width of the sliding block in a sliding direction of the sliding block.

15. The foldable display apparatus according to claim 14, wherein a width of the cavity in the sliding direction of the sliding block is d;

wherein the width of the sliding block in the sliding direction of the sliding block is d1, and a distance that the sliding block capable of moving in the sliding frame in the sliding direction of the sliding block is d2; and d is equal to a sum of d1 and d2 (d=d1+d2).

16. The foldable display apparatus according to claim 15, wherein the at least one fixing assembly further includes magnetic films, each magnetic film is disposed on a respective one of two sidewalls inside the sliding frame in the sliding direction of the sliding block; wherein the magnetic films are each configured to attract the sliding block.

17. The foldable display apparatus according to claim 16, wherein the at least one fixing assembly further includes an upper cover, the upper cover is disposed on the sliding frame, and a portion of the upper cover facing the second connecting rod has an opening; wherein the opening is configured to allow the second connecting rod to move therethrough.

18. A foldable display terminal, comprising the foldable display apparatus according to claim 1.

* * * * *